(12) United States Patent
Mora et al.

(10) Patent No.: US 6,479,319 B1
(45) Date of Patent: Nov. 12, 2002

(54) CONTACT ESCAPE PATTERN

(75) Inventors: Leonard L. Mora, San Jose, CA (US); Farshad Ghahghahi, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/839,925

(22) Filed: Apr. 20, 2001

(51) Int. Cl.[7] .......................... H01L 21/44; H01L 21/82
(52) U.S. Cl. ........................ 438/106; 438/128; 438/129
(58) Field of Search .............................. 438/106, 108, 438/109, 110, 111, 121, 128, 129; 257/503, 734, 784

(56) References Cited

U.S. PATENT DOCUMENTS

| | | | |
|---|---|---|---|
| 4,667,219 A | * 5/1987 | Lee et al. ..................... | 357/68 |
| 5,376,588 A | 12/1994 | Pendse | |
| 5,696,027 A | 12/1997 | Crane, Jr. | |
| 5,929,517 A | * 7/1999 | Distefano et al. ........... | 257/707 |
| 5,952,726 A | 9/1999 | Liang | |
| 6,048,753 A | 4/2000 | Farnworth | |
| 6,064,113 A | 5/2000 | Kirkman | |
| 6,111,756 A | 8/2000 | Moresco | |
| 6,198,635 B1 | 3/2001 | Shenoy et al. | |
| 6,307,259 B1 | * 10/2001 | Asada et al. ................ | 257/691 |

* cited by examiner

Primary Examiner—Michael Sherry
Assistant Examiner—Scott B. Geyer
(74) Attorney, Agent, or Firm—Luedeka, Neely & Graham, PC

(57) ABSTRACT

A substrate for electrically connecting to an integrated circuit, where the integrated circuit has differential pairs of signals that are associated with differential pairs of integrated circuit contacts. Differential pairs of substrate contacts are disposed on a first substrate layer in alignment with the differential pairs of integrated circuit contacts. Differential pairs of vias are also disposed on the first substrate layer, and extend to at least one underlying substrate layer. The differential pairs of vias make electrical connections with the differential pairs of substrate contacts. Each via within a given one of the differential pairs of vias is disposed within a column with each other on the first substrate layer. The columns for each of the differential pairs of vias are in a substantially parallel arrangement one with another. Differential pairs of traces are disposed on the at least one underlying substrate layer. The differential pairs of traces make electrical connection with the differential pairs of vias. Each trace within a given one of the differential pairs of traces is disposed adjacent each other, and routed to a peripheral portion of the at least one underlying substrate layer in a substantially side by side arrangement.

5 Claims, 5 Drawing Sheets

Fig. 2

CONTACT ESCAPE PATTERN

FIELD

This invention relates to the field of integrated circuits. More particularly this invention relates to the field of integrated circuit packaging designs for increasing the number of electrical connections to an integrated circuit without increasing the surface area of the integrated circuit used for the electrical connections, or decreasing the surface area of the integrated circuit used for the electrical connections without decreasing the number of electrical connections.

BACKGROUND

As the number of component circuits within an integrated circuit increases, there tends to be a commensurate pressure to increase the number of electrical connections to the integrated circuit. However, increasing the number of electrical connections is often accompanied by an increase in the surface area of the integrated circuit that is used to make the electrical connections. As there is also a continual incentive to reduce the overall size of the integrated circuit, increasing the number of electrical connections to an integrated circuit is a design goal that is often at odds against reducing the size of the integrated circuit.

What is needed therefore, is an electrical connection system for an integrated circuit that increases the number of electrical connections within a given amount of surface area of the integrated circuit, or conversely, which allows the size of the integrated circuit to be reduced without reducing the number of electrical connections to the integrated circuit.

SUMMARY

The above and other needs are provided by a substrate for electrically connecting to an integrated circuit, where the integrated circuit has differential pairs of signals that are associated with differential pairs of integrated circuit contacts on the integrated circuit. The substrate has a first substrate layer and at least one underlying substrate layer.

Differential pairs of substrate contacts are disposed on the first substrate layer in alignment with the differential pairs of integrated circuit contacts. The differential pairs of substrate contacts make electrical connections with the differential pairs of integrated circuit contacts. The differential pairs of substrate contacts receive the differential pairs of signals from the integrated circuit through the differential pairs of integrated circuit contacts. The differential pairs of substrate contacts also send the differential pairs of signals to the integrated circuit through the differential pairs of integrated circuit contacts.

Differential pairs of vias are also disposed on the first substrate layer, and extend to the at least one underlying substrate layer. The differential pairs of vias make electrical connections with the differential pairs of substrate contacts. The differential pairs of vias also receive the differential pairs of signals from the integrated circuit through the differential pairs of substrate contacts. Further, the differential pairs of vias send the differential pairs of signals to the integrated circuit through the differential pairs of substrate contacts. Each via within a given one of the differential pairs of vias is disposed within a column with each other on the first substrate layer. The columns for each of the differential pairs of vias are in a substantially parallel arrangement one with another.

Differential pairs of traces are disposed on the at least one underlying substrate layer. The differential pairs of traces make electrical connection with the differential pairs of vias. The differential pairs of traces also receive the differential pairs of signals from the integrated circuit through the differential pairs of vias. Further, the differential pairs of traces send the differential pairs of signals to the integrated circuit through the differential pairs of vias. Each trace within a given one of the differential pairs of traces is disposed adjacent each other, and routed to a peripheral portion of the at least one underlying substrate layer in a substantially side by side arrangement.

Thus, by disposing the differential contacts in a manner that the differential vias are in a substantially parallel and columnar format, the differential traces may be then placed in positions that are substantially adjacent one to another, and may be routed closer together. Thus, a greater number of traces can be disposed within a given amount of surface area of the substrate.

In other aspects of the invention, a packaged integrated circuit is provided, and a method for electrically connecting an integrated circuit to a substrate is described.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 2 is a top plan view of a contact array pattern according to the present invention.

DETAILED DESCRIPTION

Figure 1:
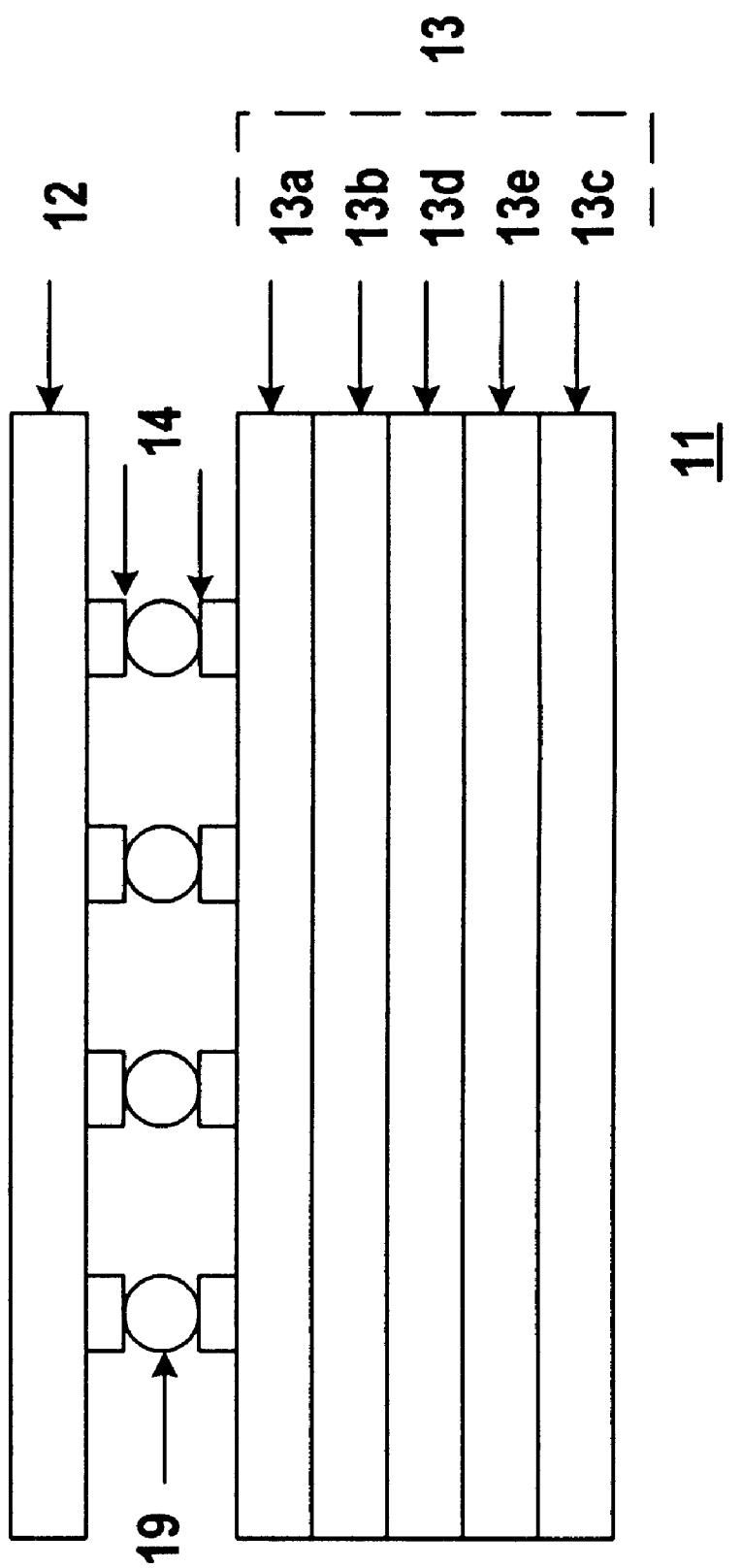
FIG. 1 is a cross-sectional view of an integrated circuit package according to the present invention.

Referring now to FIG. 1 there is depicted a cross-sectional view of a portion of an integrated circuit package 11. The integrated circuit package 11 includes at least in part a integrated circuit 12 and a substrate 13 having one or more layers. As can be seen in FIG. 1, the integrated circuit 12 is electrically connected to the substrate 13 through electrical contacts 14 on the mating surfaces of the integrated circuit 12 and the topmost layer 13a of the substrate 13. The electrical connections between the contacts 14 are preferably made by electrically conductive elements such as solder bumps 19. It is appreciated that the thicknesses and other dimensions of the various elements depicted in FIG. 1 are not at all to scale, but rather are depicted so as to facilitate understanding of the various elements. It is also appreciated that the various numbers of elements depicted and described is representational, and that in actual practice either a greater or fewer number of elements may be utilized.

Figure 2:
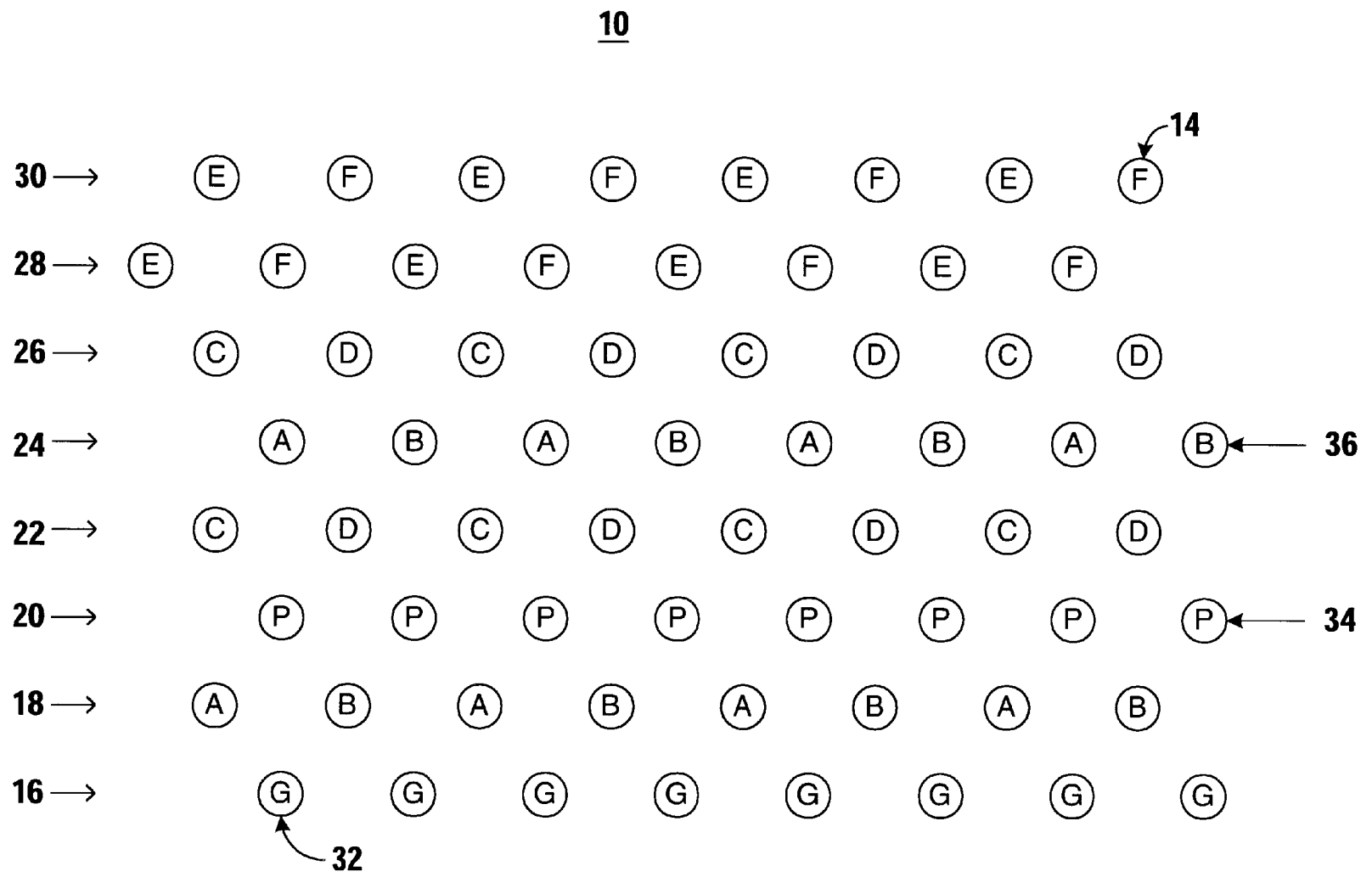

As best shown in FIG. 2, the first substrate layer 13a includes a contact pattern, preferably arranged as a staggered array 10 of the electrical contacts 14. FIG. 2 shows just a portion of the staggered array 10, which can be replicated in any direction to make the staggered array 10 larger, in a manner as described in more detail hereafter. According to the invention, the staggered array 10 of contacts 14 on the first substrate layer 13a provides an electrical interface between one or more layers 13b and 13c and the integrated circuit 12. It is appreciated that although only three layers 13a, 13b, and 13c of the substrate 13 are depicted in the example described herein, the invention is equally applicable to substrates 13 have a greater or lesser number of individual layers, such as may be required by a larger or smaller number of contacts 14 in the array of contacts 10, respectively. Further, the various elements as disposed on the various layers as described herein is also representational, and may be disposed on other layers.

Figure 5:
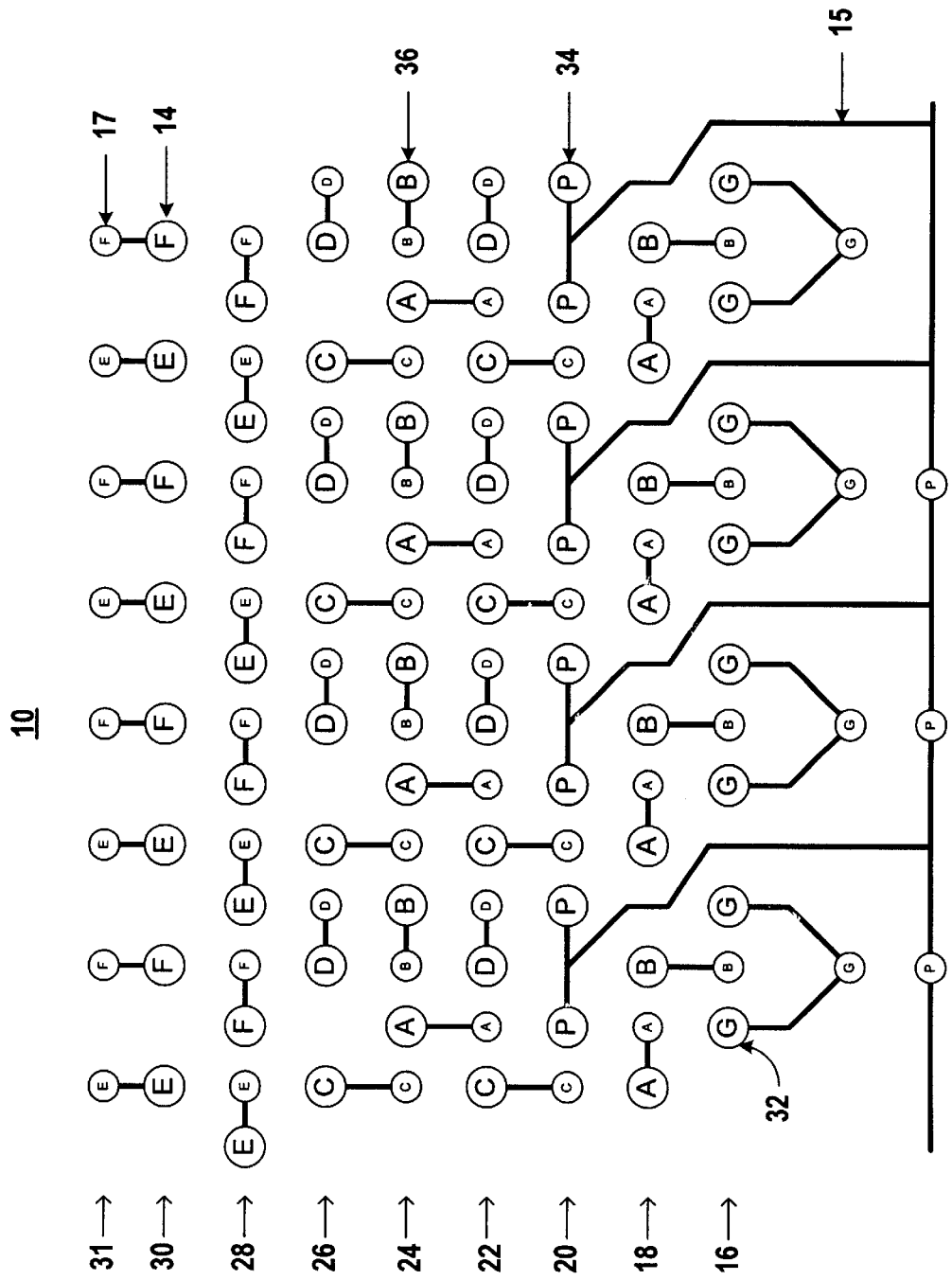
FIG. 5 is a top plan view of the contact array pattern and a via array pattern.

The contacts 14 on the first substrate layer 13a are electrically connected to vias 17 that are disposed in a via array on the first substrate layer 13a, as depicted in FIG. 5. As depicted in FIG. 5, the vias 17 are smaller than the contacts 14. However, it is appreciated that this is representational only, and the figures are not to scale. Rather, the figures have been drafted so as to aid understanding. In actual practice, the vias 17 may be larger than, the same size as, or smaller than the contacts 14, or a combination of one or more relative sizes, as desired.

The vias 17 provide electrical connections between the different layers 13a, 13b, and 13c of the substrate 13, and extend through one or more of the layers 13a, 13b, and 13c of the substrate 13. The preferred goal is to route the electrical signals received in the relatively tightly packed contact array 10 on the first substrate layer 13a to signal traces 15 on one or more of the substrate layers 13a, 13b, or 13c as depicted in FIGS. 3 and 4, in such a manner that the traces 15 preferably spread out in a larger surface area than the tightly packed contact array 10, and can be more readily connected to electrically by other components.

As shown in FIG. 2, each row and column of the staggered array 10 of contacts 14 is offset from an adjacent row and column of contacts 14. That is, contacts 14 located in a first row 16 are offset from the contacts 14 located in an adjacent row 18. Stated another way, the contact array 10 is a non-orthogonal array of contacts 14. Likewise, the contacts 14 in row 18 are offset relative to the contacts 14 in row 20, etc. As will be described in greater detail below, this offset configuration of contacts 14 allows for an optimal routing of the traces 15 in the lower substrate layers 13b and 13c. Furthermore, the staggered array 10 of contacts 14, allows for a greater number of traces 15 on the substrate layers 13b, and 13c in a relatively reduced surface area.

Figure 3:
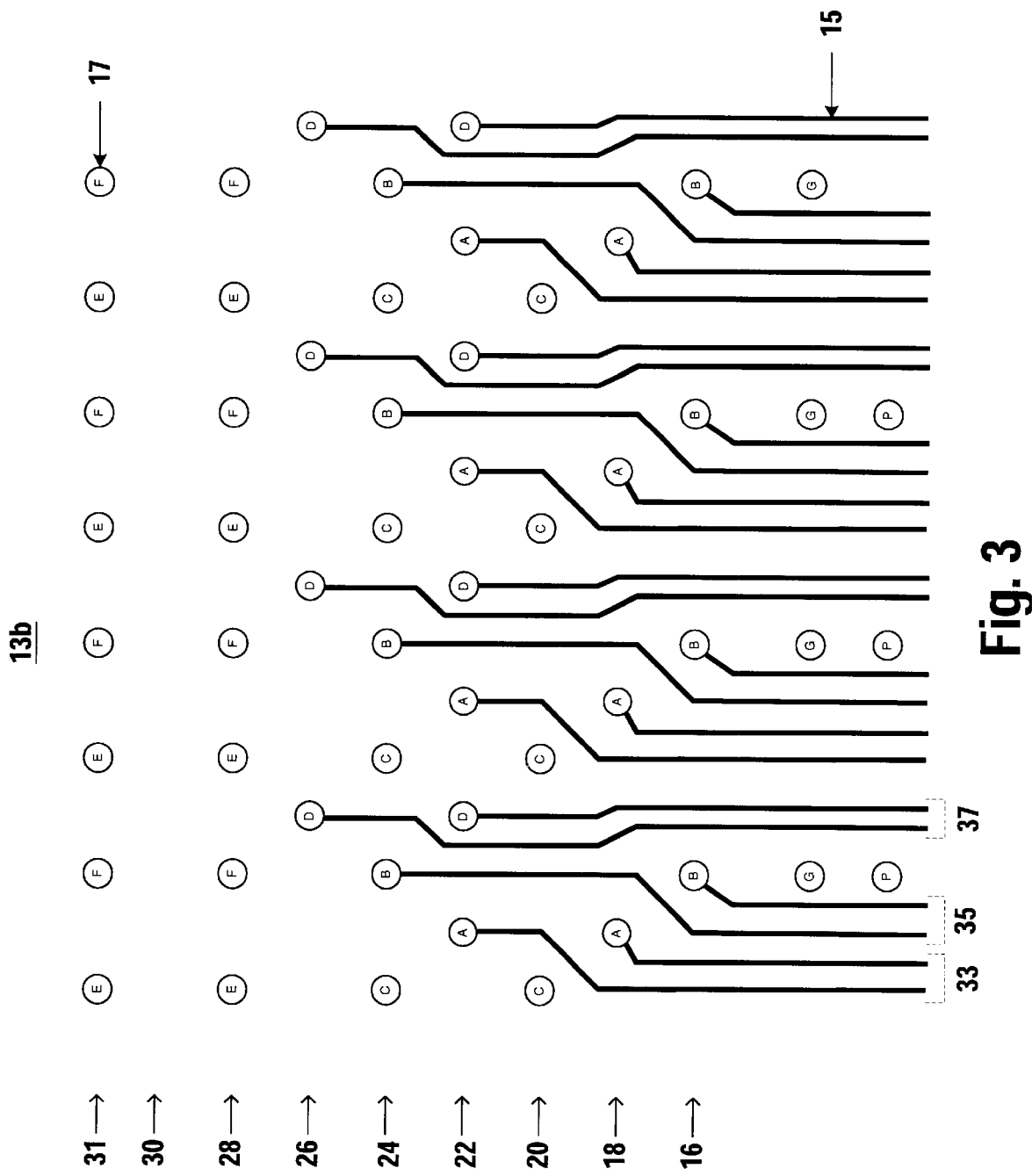
FIG. 3 is a top plan view of a first embodiment of a via array and trace pattern.
Figure 4:
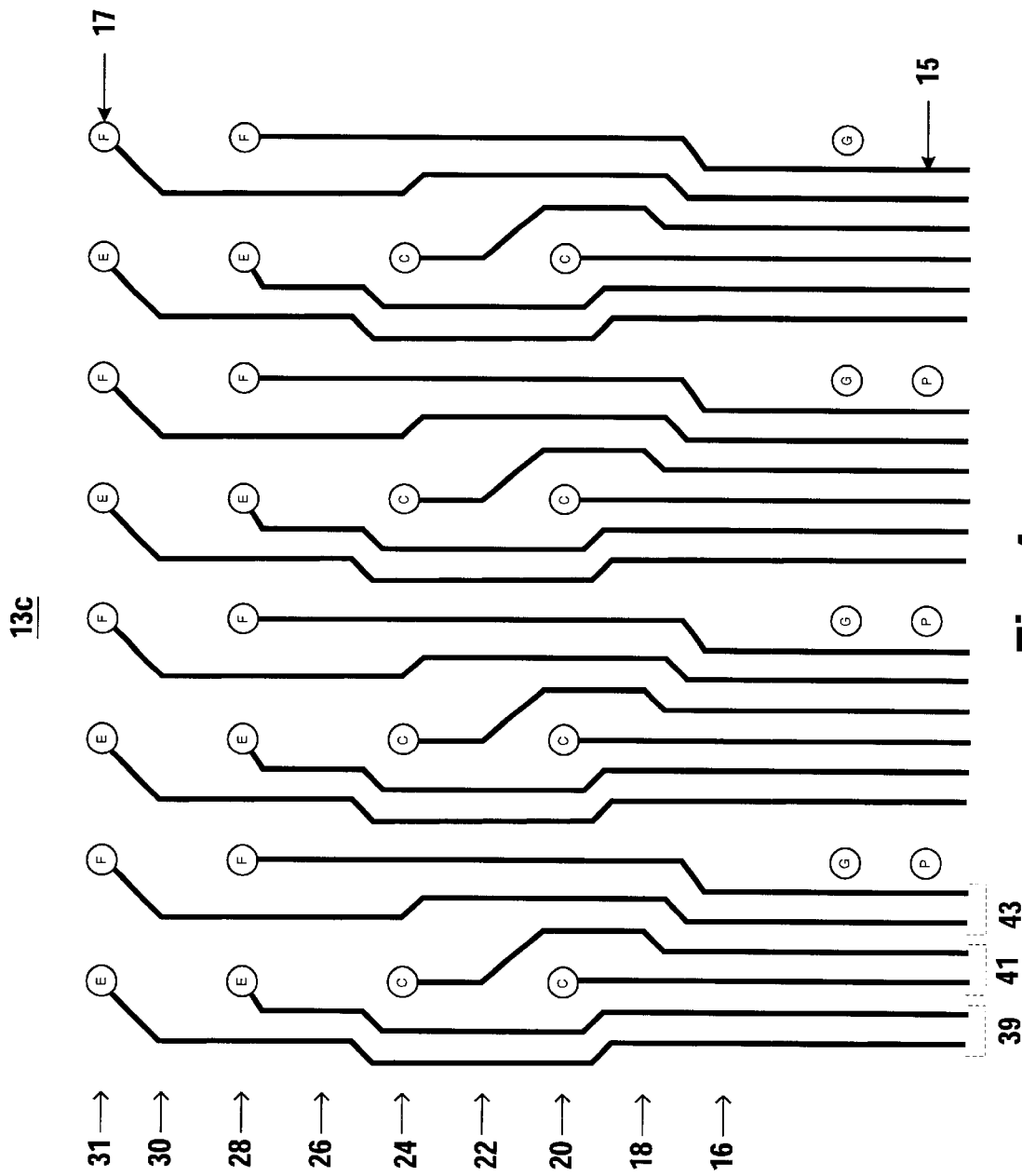
FIG. 4 is a top plan view of a second embodiment of a via array and trace pattern.

In a preferred embodiment of the invention, as best shown in FIGS. 2–4, the contact array 10 of the first substrate layer 13a includes eight rows 16, 18, 20, 22, 24, 26, 28, and 30 of contacts 14. Each row 16–30 includes a plurality of contacts 14. Eight contacts 14 are shown in FIG. 2 for each row 16–30. However, as alluded to above, it is appreciated that this array pattern can be repeated by either increasing the number of contacts 14 in each row, or by increasing the number of rows as necessary to provide the desired number of contacts 14.

As described above and in greater detail below, each row, 18, 22, 24, 26, 28, and 30 contains a number of contacts 14, each contact 14 corresponding to a specific electrical signal connection. According to the preferred embodiment, rows 16 and 20 include at least some of the ground and power signal connections, respectively. That is, row 16 preferably includes a plurality of ground contacts 32. Each of the ground contacts 32 provide electrical ground connections for the integrated circuit 12. Likewise, row 20 preferably includes a plurality of power contacts 34. Each of the power contacts 34 provide electrical power connections for the integrated circuit 12. Contacts 14 that are neither power contacts 34 or ground contacts 32 are signal contacts 36.

The contact array 10 is preferably comprised of contacts 14 that conduct different signals to and from the integrated circuit 12. Some of the signals conducted through the contacts 14 have similar properties, and thus, when the traces 15 associated with such contacts 14 are routed adjacent one another, the traces 15 may be placed in closer proximity than is typically permissible for good signal integrity, or in other words, when the traces 15 of similar signals are routed adjacent one another, the signals do not degrade in a manner or to a degree that they otherwise might.

Certain pairs of contacts 14 are designated as differential pairs. As an extension of this, there are differential pairs of signals, differential pairs of vias 17, and differential pairs of traces 15. All of the differential pairs of elements are determined by the similarity of certain related properties, such as traces 15 that have equivalent lengths. According to the preferred embodiment as shown in FIG. 2, there are six sets of differential pair contacts 14 in the contact array 10, which sets are designated as A–F. The ground contacts are designated as G, and the power contacts are designated as P.

As a part of the invention disclosed herein, the differential pairs of contacts 14 are electrically connected to differential pairs of vias 17 that are preferably disposed in different rows of the via array one from another, and are further preferably disposed within a single column of vias 17 relative to each other. This over-under configuration of differential pairs of vias 17, accomplished in part by staggering the contacts 14, provides additional space for routing the signal traces 15 on the underlying layers 13b and 13c of the substrate 13, as compared to a conventional orthogonal array of contacts. FIG. 5 shows the preferred arrangement of electrically connecting the differential pairs of contacts 14 to the differential pairs of vias 17. Those via 17 pairs that are of the same type, as designated in FIG. 5, and which are disposed in a same column are designated as the differential pairs. As can be seen in FIG. 3, a new row 31 of vias 17 is preferably created in the process.

The vias 17 are then preferably routed down through one or more of the layers 13a, 13b, and 13c, to provide the electrical signals to the various layers of the substrate 13, as desired. As shown in FIGS. 3 and 4, one end of each signal trace 15 is electrically connected to one of the vias 17. The opposing ends of each signal trace 15 are preferably routed to connections elsewhere on the substrate 13. A pair of signal traces 15 is preferably electrically connected to a differential pair of vias 17 such that each of the signal traces 15 within such a pair is disposed adjacent the other signal trace 15 in the pair. By aligning the vias 17 in columns, the integrated circuit package 11 is able to accommodate a greater number of signal traces 15, and therefore a greater number of electrical connections, without having to increase the size of the integrated circuit package 11. Moreover, the integrated circuit package 11 can be minimized for a given number of signal traces 15.

In the most preferred embodiment, the vias 17 for the differential via pairs that are routed out with traces 15 on layer 13b do not extend to layers of the substrate 13 disposed below layer 13b. Further, layer 13b is the next layer below layer 13a in the preferred embodiment, or in other words, layer 13b is the second layer and layer 13a is the first layer. Most preferably, layer 13c is the fifth layer in the substrate 13. Thus, there are preferably two layers 13d and 13e between the second layer 13b and the fifth layer 13c. The two layers 13d and 13e are preferably the third and fourth layer, respectively. These layers may serve other functions, such as providing the ground plane and the power plane, or may serve alternate functions.

As seen in FIG. 3, differential pair of traces 33 are electrically connected to the differential pair of vias 17 designated as "A," differential pair of traces 35 are electrically connected to the differential pair of vias 17 designated as "B," and differential pair of traces 37 are electrically connected to the differential pair of vias 17 designated as "D." Similarly, as seen in FIG. 4, differential pair of traces 39 are electrically connected to the differential pair of vias 17 designated as "E," differential pair of traces 41 are electrically connected to the differential pair of vias 17 designated as "C," and differential pair of traces 43 are electrically connected to the differential pair of vias 17 designated as "F."

It is appreciated that the specific routing patterns of the traces 15 as depicted in the figures and described herein are representational only, and that in actual practice, different routing patterns may be selected. However, by routing the differential pairs of traces 15 adjacent one another in the manner as described herein, closer routing of the traces 15 may be accomplished. This tends to reduce the amount of surface area required for the routing pattern, thus allowing for an overall reduction in the size of the substrate 13.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for electrically connecting a substrate to an integrated circuit having differential pairs of signals that are associated with differential pairs of integrated circuit contacts on the integrated circuit, the method comprising the steps of:

disposing differential pairs of substrate contacts on a first substrate layer of the substrate in a staggered array and in alignment with the differential pairs of integrated circuit contacts, making electrical connections between the differential pairs of substrate contacts and the differential pairs of integrated circuit contacts, receiving the differential pairs of signals from the integrated circuit through the differential pairs of integrated circuit contacts, sending the differential pairs of signals to the integrated circuit through the differential pairs of integrated circuit contacts, disposing differential pairs of vias on the first substrate layer and extending to at least one underlying substrate layer, disposing each via within a given one of the differential pairs of vias within a column with each other on the first substrate layer, where the columns for each of the differential pairs of vias are in a substantially parallel arrangement one with another, making electrical connections between the differential pairs of vias and the differential pairs of substrate contacts, receiving the differential pairs of signals from the integrated circuit through the differential pairs of substrate contacts, sending the differential pairs of signals to the integrated circuit through the differential pairs of substrate contacts, disposing differential pairs of traces on the at least one underlying substrate layer, disposing each trace within a given one of the differential pairs of traces adjacent each other and routed to a peripheral portion of the at least one underlying substrate layer in a substantially side by side arrangement, making electrical connections between the differential pairs of traces and the differential pairs of vias, receiving the differential pairs of signals from the integrated circuit through the differential pairs of vias, and sending the differential pairs of signals to the integrated circuit through the differential pairs of vias.

2. A method for electrically connecting a substrate to an integrated circuit having pairs of signals that are associated with pairs of integrated circuit contacts on the integrated circuit, the method comprising the steps of:

disposing pairs of substrate contacts on a first substrate layer of the substrate in alignment with the pairs of integrated circuit contacts, wherein the pairs of substrate contacts are disposed in rows, by;

defining a first pair of substrate contacts with a first substrate contact in a first row and a second substrate contact in a third row, defining a second pair of substrate contacts with a third substrate contact in the first row and a fourth substrate contact in the third row, defining a third pair of substrate contacts with a fifth substrate contact in a second row and a sixth substrate contact in a fourth row, defining a fourth pair of substrate contacts with a seventh substrate contact in the second row and a eighth substrate contact in the fourth row, defining a fifth pair of substrate contacts with a ninth substrate contact in a fifth row and a tenth substrate contact in a sixth row, and defining a sixth pair of substrate contacts with a eleventh substrate contact in the fifth row and a twelfth substrate contact in the sixth row, making electrical connections between the pairs of substrate contacts and the pairs of integrated circuit contacts, receiving the pairs of signals from the integrated circuit through the pairs of integrated circuit contacts, sending the pairs of signals to the integrated circuit through the pairs of integrated circuit contacts, disposing pairs of vias on the first substrate layer and extending to at least one underlying substrate layer, disposing each via within a given one of the pairs of vias within a column with each other on the first substrate layer, where the columns for each of the pairs of vias are in a substantially parallel arrangement one with another, making electrical connections between the pairs of vias and the pairs of substrate contacts, receiving the pairs of signals from the integrated circuit through the pairs of substrate contacts, sending the pairs of signals to the integrated circuit through the pairs of substrate contacts, disposing pairs of traces on the at least one underlying substrate layer, disposing each trace within a given one of the pairs of traces adjacent each other and routed to a peripheral portion of the at least one underlying substrate layer in a substantially side by side arrangement, making electrical connections between the pairs of traces and the pairs of vias, receiving the pairs of signals from the integrated circuit through the pairs of vias, and sending the pairs of signals to the integrated circuit through the pairs of vias.

3. The method of claim 2, further comprising making power and ground connections between the substrate and the integrated circuit.

4. The method of claim 3, further comprising disposing the power connections in a row and the ground connections in a row, and interspersing the row of power connections and the row of ground connections between the rows of substrate contacts.

5. The method of claim 4, comprising disposing the row of power connections between the first and second rows of substrate contacts and disposing the row of ground connections adjacent the first row of substrate contacts and not adjacent the row of power connections.

* * * * *